United States Patent
Sung

(10) Patent No.: US 8,295,103 B2
(45) Date of Patent: Oct. 23, 2012

(54) LEVEL SHIFTING CIRCUIT AND NONVOLATILE SEMICONDUCTOR MEMORY APPARATUS USING THE SAME

(75) Inventor: Moon Soo Sung, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 153 days.

(21) Appl. No.: 12/949,502

(22) Filed: Nov. 18, 2010

(65) Prior Publication Data

US 2011/0128799 A1 Jun. 2, 2011

(30) Foreign Application Priority Data

Nov. 27, 2009 (KR) .................. 10-2009-0115898

(51) Int. Cl.
*G11C 5/14* (2006.01)
*G11C 7/00* (2006.01)
*H03K 19/094* (2006.01)

(52) U.S. Cl. ............... 365/189.11; 365/189.09; 326/68; 326/80; 326/81

(58) Field of Classification Search ............... 365/189.11
See application file for complete search history.

(56) References Cited

U.S. PATENT DOCUMENTS

| 5,723,985 | A | 3/1998 | Tran et al. |
| 6,242,962 | B1 * | 6/2001 | Nakamura ................. 326/81 |
| 6,693,819 | B2 | 2/2004 | Smith et al. |
| 6,774,704 | B2 * | 8/2004 | Kushnarenko ............ 327/530 |
| 6,930,923 | B2 * | 8/2005 | Chen et al. ............ 365/185.23 |
| 7,449,917 | B2 * | 11/2008 | Cheon ......................... 326/68 |
| 2003/0128576 | A1 | 7/2003 | Smith et al. |
| 2003/0202398 | A1 | 10/2003 | Smith et al. |
| 2004/0257859 | A1 | 12/2004 | Smith et al. |
| 2007/0211531 | A1 | 9/2007 | Atti et al. |
| 2008/0238522 | A1 * | 10/2008 | Thorp et al. ............... 327/333 |
| 2010/0164592 | A1 * | 7/2010 | Kim et al. ................. 327/333 |

FOREIGN PATENT DOCUMENTS

| JP | 2002-150784 | | 5/2002 |
| JP | 2006-066051 | | 3/2006 |
| KR | 100464113 | B1 | 12/2004 |

* cited by examiner

*Primary Examiner* — Son Mai
(74) *Attorney, Agent, or Firm* — William Park & Associates Ltd.

(57) ABSTRACT

A nonvolatile semiconductor memory apparatus includes a control unit configured to generate a select signal and a driving control signal in response to a first enable signal and a second enable signal; a level shifting unit configured to enable a first shifting signal or a second shifting signal to a level of a pumping voltage in response to the select signal and the driving control signal; a first switching unit configured to apply a program voltage to a word line when the first shifting signal is enabled to the level of the pumping voltage; and a second switching unit configured to apply a pass voltage to the word line when the second shifting signal is enabled to the level of the pumping voltage.

22 Claims, 4 Drawing Sheets

US 8,295,103 B2

1

LEVEL SHIFTING CIRCUIT AND NONVOLATILE SEMICONDUCTOR MEMORY APPARATUS USING THE SAME

CROSS-REFERENCE TO RELATED APPLICATION

The present application claims priority under 35 U.S.C. §119(a) to Korean Application No. 10-2009-0115898, filed on Nov. 27, 2009, in the Korean Intellectual Property Office, which is incorporated herein by reference in its entirety as if set forth in full.

BACKGROUND OF THE INVENTION

1. Technical Field

Various embodiments of the present disclosure generally relate to a semiconductor memory apparatus, and more particularly, to a level shifting circuit and a nonvolatile semiconductor memory apparatus using the same.

2. Related Art

FIG. 1 is a diagram showing a configuration of a nonvolatile semiconductor memory apparatus of related art. A nonvolatile memory apparatus may comprise, as shown in FIG. 1, a first level shifter 10, a first switching unit 20, a second level shifter 30, and a second switching unit 40.

The first level shifter 10 generates a first shifting signal en1_ls with a level of a pumping voltage VPP when a first enable signal en1 is enabled, and generates the first shifting signal en1_ls with a level of a ground voltage VSS when the first enable signal en1 is disabled.

The first switching unit 20 is turned on when the first shifting signal en1_ls is enabled to the level of the pumping voltage VPP and transfers a program voltage V_pgm to a word line WL. The first switching unit 20 intercepts the transfer of the program voltage V_pgm to the word line WL when the first shifting signal en1_ls is disabled to the level of the ground voltage VSS.

The second level shifter 30 generates a second shifting signal en2_ls with the level of the pumping voltage VPP when a second enable signal en2 is enabled, and generates the second shifting signal en2_ls with the level of the ground voltage VSS when the second enable signal en2 is disabled.

The second switching unit 40 is turned on when the second shifting signal en2_ls is enabled to the level of the pumping voltage VPP and transfers a pass voltage V_pass to the word line WL. The second switching unit 40 intercepts the transfer of the pass voltage V_pass to the word line WL when the second shifting signal en2_ls is disabled to the level of the ground voltage VSS.

The program voltage V_pgm is a voltage for enabling the word line WL, and memory cells connected to the word line WL are programmed when the word line WL is enabled to the level of the program voltage V_pgm. A word line (not shown), which is most adjacent to the word line WL enabled to the level of the program voltage V_pgm, is designed to be applied with the pass voltage V_pass. This is to prevent the occurrence of programming defects due to a coupling phenomenon between the word line WL with a voltage level raised to the level of the program voltage V_pgm and the word line not applied with the program voltage V_pgm.

The first level shifter 10 and the second level shifter 30 have the same configuration except for the different input signals en1 and en2 and the different output signals en1_ls and en2_ls. Therefore, the explanation for the configuration of the first level shifter 10 also applies to the configuration of the second level shifter 30.

2

FIG. 2 is a diagram showing a configuration of the typical first level shifter 10 of the related art shown in FIG. 1. Referring to FIG. 2, the first level shifter 10 includes first through eighth transistors P1 through P6, N1 and N2, and first and second inverters IV1 and IV2.

In the first level shifter 10, if the first enable signal en1 is enabled to a high level, the eighth transistor N2 is turned on and consequently turns on the second transistor P2. When the second transistor P2 is turned on, the pumping voltage VPP is outputted through the first through third transistors P1 through P3 as the voltage level of the first shifting signal en1_ls.

In the first level shifter 10, if the first enable signal en1 is disabled to a low level, the seventh transistor N1 is turned on, and the ground voltage VSS is outputted as the voltage level of the first shifting signal en1_ls.

Despite that the first level shifter 10 and the second level shifter 30 perform the same function of level-shifting the enable voltage levels of the enable signals en1 and en2 inputted thereto to the level of the pumping voltage VPP, both are designed to be present in the nonvolatile semiconductor memory apparatus.

SUMMARY OF THE INVENTION

Various aspects of the present invention comprise a level shifting circuit with a reduced area and a nonvolatile semiconductor memory apparatus using the same.

In one aspect of the present invention, a nonvolatile semiconductor memory apparatus comprises a control unit configured to generate a select signal and a driving control signal in response to a first enable signal and a second enable signal; a level shifting unit configured to enable a first shifting signal or a second shifting signal to a level of a pumping voltage in response to the select signal and the driving control signal; a first switching unit configured to apply a program voltage to a word line when the first shifting signal is enabled to the level of the pumping voltage; and a second switching unit configured to apply a pass voltage to the word line when the second shifting signal is enabled to the level of the pumping voltage.

In another aspect of the present invention, a level shifting circuit of a nonvolatile semiconductor memory apparatus comprises a level shifting unit configured to enable a first shifting signal or a second shifting signal to a level of a pumping voltage in response to a select signal when a driving control signal is enabled, and disable both the first shifting signal and the second shifting signal to a level of a ground voltage when the driving control signal is disabled.

In another aspect of the present invention, a level shifting circuit of a nonvolatile semiconductor memory apparatus is configured to enable a first shifting signal or a second shifting signal to a level of a pumping voltage when a first select activation signal or a second select activation signal is enabled to a level of a supply voltage, with a voltage level of a first output node corresponding to a voltage level of the first shifting signal and a voltage level of a second output node corresponding to a voltage level of the second shifting signal, the level shifting circuit comprising a first switching portion configured to apply a ground voltage to the second output node when the first select activation signal is enabled; a second switching portion configured to apply the ground voltage to the first output node when the second select activation signal is enabled; a third switching portion configured to output the pumping voltage when the first select activation signal is disabled; a fourth switching portion configured to apply the pumping voltage outputted from the third switching portion to the second output node when the first output node receives the ground voltage; a fifth switching portion configured to output the pumping voltage when the second select activation signal is disabled; and a sixth switching portion configured to apply the pumping voltage outputted from the fifth switching portion to the first output node when the second output node receives the ground voltage.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION OF THE EMBODIMENTS

Figure 1:
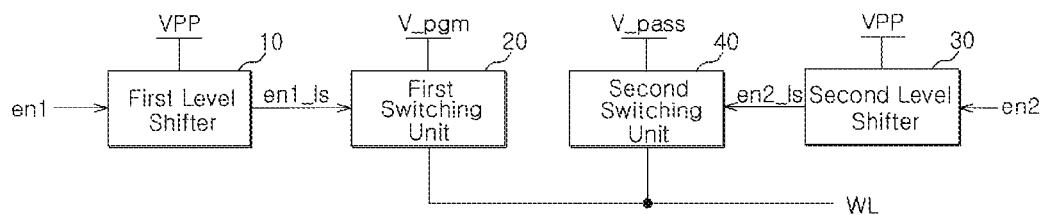
FIG. 1 is a diagram showing a configuration of a nonvolatile semiconductor memory apparatus of related art.

Advantages and characteristics of the present invention and a method for achieving them will be apparent with reference to embodiments described below with reference to the accompanying drawings. However, the present invention is not limited to the exemplary embodiments described below but may be implemented in various forms. Therefore, the exemplary embodiments are provided to enable those skilled in the art to thoroughly understand the teaching of the present invention and to completely inform the scope of the present invention and the exemplary embodiment is just defined by the scope of the appended claims. Throughout the specification, like elements refer to like reference numerals.

Figure 3:
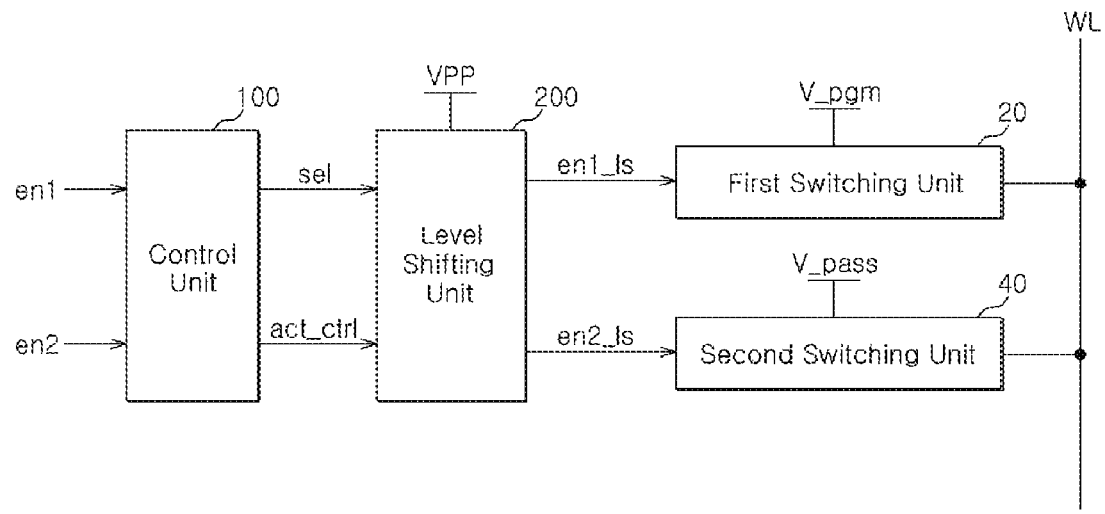
FIG. 3 is a diagram schematically illustrating a nonvolatile semiconductor memory apparatus in accordance with one embodiment of the present invention.

FIG. 3 is a diagram schematically illustrating a nonvolatile semiconductor memory apparatus in accordance with one embodiment of the present invention. Referring to FIG. 3, the nonvolatile semiconductor memory apparatus in accordance with the embodiment comprises a control unit 100, a level shifting unit 200, a first switching unit 20, and a second switching unit 40. The level shifting unit 200 may be called a level shifting circuit. In the signals of the embodiment described below, an enable level of first and second shifting signals en1_ls and en2_ls is a level of a pumping voltage VPP, and the enable level of the other signals is the level of a supply voltage VCC. The pumping voltage VPP has a voltage level higher than the supply voltage VCC.

The control unit 100 generates a select signal sel and a driving control signal act_ctrl in response to a first enable signal en1 and a second enable signal en2.

The level shifting unit 200 enables the first shifting signal en1_ls or the second shifting signal en2_ls to the level of the pumping voltage VPP in response to the select signal sel and the driving control signal act_ctrl.

The first switching unit 20 applies a program voltage V_pgm to a word line WL when the first shifting signal en1_ls is enabled to the level of the pumping voltage VPP.

The second switching unit 40 applies a pass voltage V_pass to the word line WL when the second shifting signal en2_ls is enabled to the level of the pumping voltage VPP. The program voltage V_pgm is a voltage for enabling the word line WL, and memory cells connected to the word line WL are programmed when the word line WL is enabled to the level of the program voltage V_pgm. A word line (not shown), which is most adjacent to the word line WL and enabled to the level of the program voltage V_pgm, is designed to be applied with the pass voltage V_pass. This is to prevent the occurrence of programming defects due to a coupling phenomenon between the word line WL with a voltage level raised to the level of the program voltage V_pgm and the word line not applied with the program voltage V_pgm.

The control unit 100 enables the driving control signal act_ctrl when any one of the first and second enable signals en1 and en2 are enabled, the select signal sel when only the first enable signal en1 of the first and second enable signals en1 and en2 is enabled, and disables the select signal sel when only the second enable signal en2 of the first and second enable signals en1 and en2 is enabled.

Figure 4:
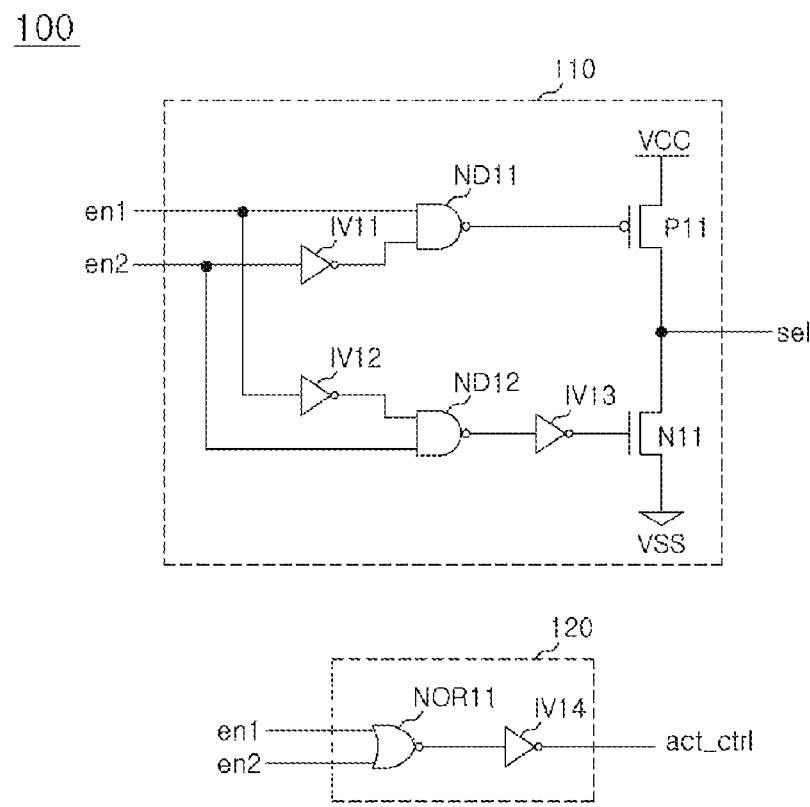
FIG. 4 is a diagram of a configuration of a control unit shown in FIG. 3.

FIG. 4 is a diagram of a configuration of the control unit 100 shown in FIG. 3. Referring to FIG. 4, the control unit 100 comprises a select signal generation section 110 and a driving control signal generation section 120.

The select signal generation section 110 enables the select signal sel if the first enable signal en1 is enabled and the second enable signal en2 is disabled, and disables the select signal sel if the first enable signal en1 is disabled and the second enable signal en2 is enabled.

The select signal generation section 110 comprises first through third inverters IV11 through IV13, first and second NAND gates ND11 and ND12, and first and second transistors P11 and N11. The first inverter IV11 receives the second enable signal en2 as an input. The second inverter IV12 receives the first enable signal en1 as an input. The first NAND gate ND11 receives the first enable signal en1 and the output signal of the first inverter IV11 as inputs. The second NAND gate ND12 receives the second enable signal en2 and the output signal of the second inverter IV12 as inputs. The third inverter IV13 receives the output signal of the second NAND gate ND12 as an input. The first transistor P11 has a source to which a supply voltage VCC is applied, and a gate to which the output signal of the first NAND gate ND11 is inputted. The second transistor N11 has a drain to which the drain of the first transistor P11 is connected, a gate to which the output signal of the third inverter IV13 is inputted, and a source to which a ground voltage VSS is applied. The select signal sel is outputted from a node to which the first transistor P11 and the second transistor N11 are connected.

The driving control signal generation section 120 enables the driving control signal act_ctrl when either of the first and second enable signals en1 and en2 is enabled, and disables the driving control signal act_ctrl when both the first and second enable signals en1 and en2 are disabled.

The driving control signal generation section 120 comprises a NOR gate NOR11, and a fourth inverter IV14. The NOR gate NOR11 receives the first and second enable signals en1 and en2 as inputs. The fourth inverter IV14 receives the output signal of the NOR gate NOR11 as an input, and outputs the driving control signal act_ctrl.

The level shifting unit 200 enables the first shifting signal en1_ls or the second shifting signal en2_ls to the level of the pumping voltage VPP in response to the select signal sel when the driving control signal act_ctrl is enabled. The level shifting unit 200 enables the first shifting signal en1_ls to the level of the pumping voltage VPP and disables the second shifting signal en2_ls to the level of the ground voltage VSS when the driving control signal act_ctrl is enabled and the select signal sel is enabled. Also, the level shifting unit 200 disables the first shifting signal en1_ls to the level of the ground voltage VSS and enables the second shifting signal en2_ls to the level of the pumping voltage VPP when the driving control signal act_ctrl is enabled and the select signal sel is disabled. If the driving control signal act_ctrl is disabled, the level shifting unit 200 disables the first and second shifting signals en1_ls and en2_ls to the level of the ground voltage VSS irrespective of the select signal sel.

Figure 5:
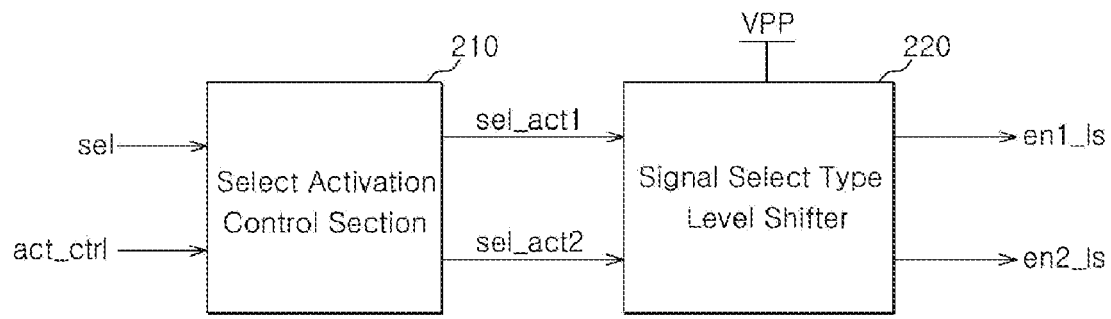
FIG. 5 is a diagram of a configuration of a level shifting unit shown in FIG. 3.

FIG. 5 is a diagram of a configuration of the level shifting unit 200 shown in FIG. 3. Referring to FIG. 5, the level shifting unit 200 comprises a select activation control section 210 and a signal select type level shifter 220.

The select activation control section 210 enables both first and second select activation signals sel_act1 and sel_act2 irrespective of the select signal sel when the driving control signal is disabled, and enables one of the first and second select activation signals sel_act1 and sel_act2 in response to the select signal sel when the driving control signal act_ctrl is enabled. The select activation control section 210 enables the first select activation signal sel_act1 and disables the second select activation signal sel_act2 when the driving control signal act_ctrl is enabled and the select signal sel is enabled. Further, the select activation control section 210 disables the first select activation signal sel_act1 and enables the second select activation signal sel_act2 when the driving control signal act_ctrl is enabled and the select signal sel is disabled.

According to one embodiment of the invention, the signal select type level shifter 220 enables the first shifting signal en1_ls to the level of the pumping voltage VPP and disables the second shifting signal en2_ls to the level of the ground voltage VSS when only the first select activation signal sel_act1 of the first and second select activation signals sel_act1 and sel-act2 is enabled. Also, the signal select type level shifter 220 disables the first shifting signal en1_ls to the level of the ground voltage VSS and enables the second shifting signal en2_ls to the level of the pumping voltage VPP when only the second select activation signal sel_act2 of the first and second select activation signals sel_act1 and sel-act2 is enabled. The signal select type level shifter 220 disables both the first and second shifting signals en1_ls and en2_ls to the level of the ground voltage VSS when both the first and second select activation signals sel_act1 and sel_act2 are enabled.

Figure 6:
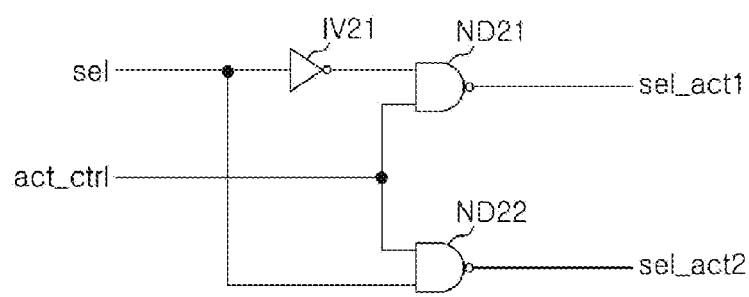
FIG. 6 is a diagram of a configuration of a select activation control section shown in FIG. 5.

FIG. 6 is a diagram of a configuration of the select activation control section 210 shown in FIG. 5. Referring to FIG. 6, the select activation control section 210 comprises a fifth inverter IV21, and third and fourth NAND gates ND21 and ND22. The fifth inverter IV21 receives the select signal sel as an input. The third NAND gate ND21 receives the output signal of the fifth inverter IV21 and the driving control signal act_ctrl as inputs and outputs the first select activation signal sel_act1. The fourth NAND gate ND22 receives the select signal sel and the driving control signal act_ctrl as inputs and outputs the second select activation signal sel_act2.

Figure 7:
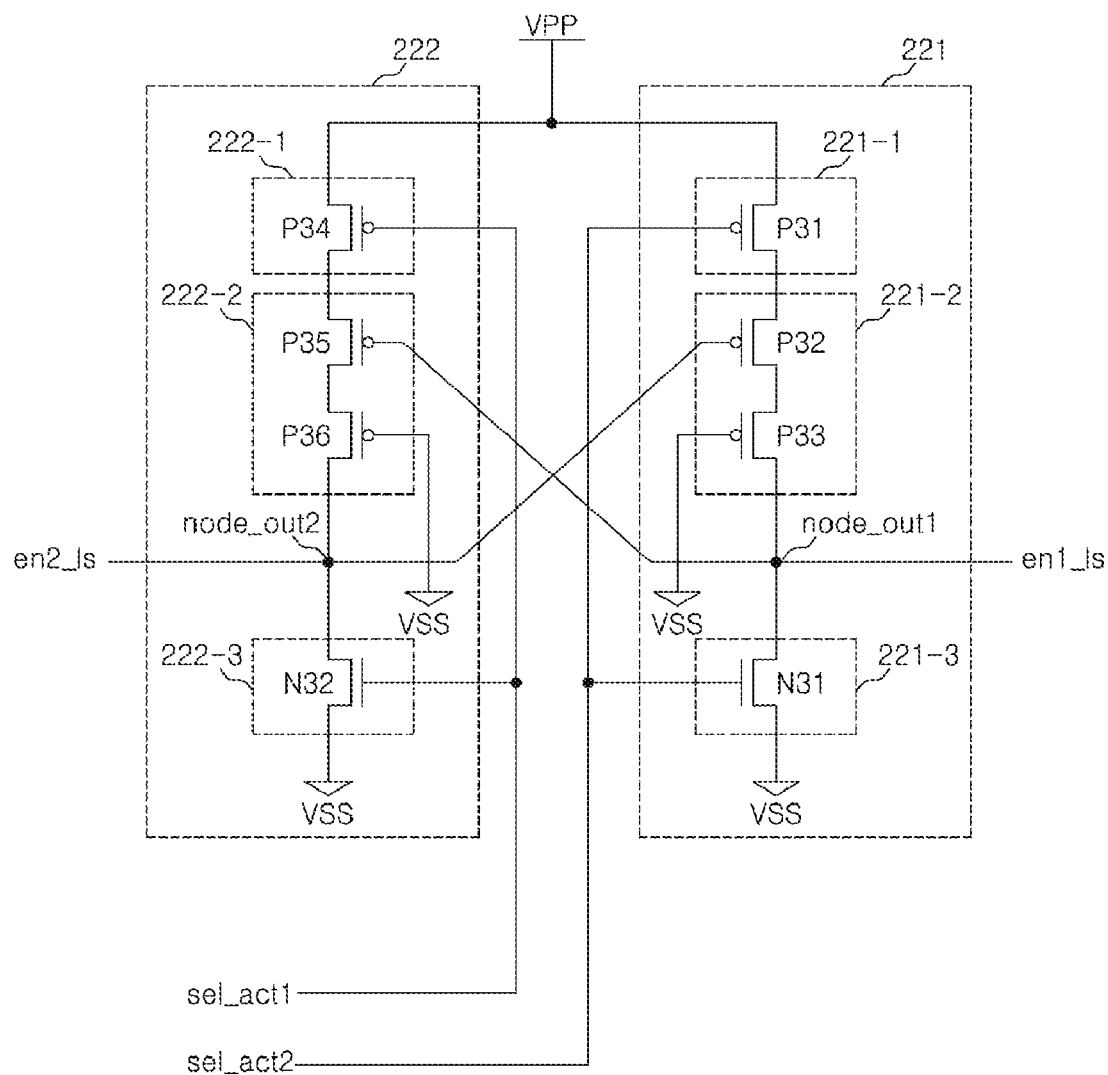
FIG. 7 is a diagram of a configuration of a signal select type level shifter shown in FIG. 5.

FIG. 7 is a diagram of a configuration of a signal select type level shifter 220 shown in FIG. 5. Referring to FIG. 7, the signal select type level shifter 220 comprises a first voltage level determining part 221 and a second voltage level determining part 222.

The first voltage level determining part 221 determines the voltage level of the first shifting signal en1_ls in response to the second select activation signal sel_act2 and the second shifting signal en2_ls. For example, the first voltage level determining part 221 generates the first shifting signal en1_ls with the level of the ground voltage VSS when the second select activation signal sel_act2 is enabled, and generates the first shifting signal en1_ls with the level of the pumping voltage VPP when the second select activation signal sel_act2 is disabled and the second shifting signal en2_ls has the level of the ground voltage VSS.

The first voltage level determining part 221 comprises first through third switching portions 221-1 through 221-3. The first switching portion 221-1 outputs the pumping voltage VPP to the second switching portion 221-2 when the second select activation signal sel_act2 is disabled. The first switching portion 221-1 comprises a third transistor P31. The third transistor P31 has a source which receives the pumping voltage VPP, a gate which receives the second select activation signal sel_act2 as an input, and a drain to which the second switching portion 221-2 is connected. The second switching portion 221-2 transfers the pumping voltage VPP outputted from the first switching portion 221-1 to a first output node node_out1 when the second shifting signal en2_ls has the level of the ground voltage VSS. The second switching portion 221-2 comprises fourth and fifth transistors P32 and P33. The fourth transistor P32 has a gate which receives the second shifting signal en2_ls as an input and a source to which the drain of the third transistor P31 is connected. The fifth transistor P33 has a gate which receives the ground voltage VSS as an input, a source to which the drain of the fourth transistor P32 is connected, and a drain to which the first output node node_out1 is connected. The third switching portion 221-3 applies the ground voltage VSS to the first output node node_out1 when the second select activation signal sel_act2 is enabled. The third switching portion 221-3 comprises a sixth transistor N31. The sixth transistor N31 has a gate which receives the second select activation signal sel_act2 as an input, a drain to which the first output node node_out1 is connected, and a source which receives the ground voltage VSS as an input.

The second voltage level determining part 222 generates the second shifting signal en2_ls with the level of the ground voltage VSS when the first select activation signal sel_act1 is enabled, and generates the second shifting signal en2_ls with the level of the pumping voltage VPP when the first select activation signal sel_act1 is disabled and the first shifting signal en1_ls has the level of the ground voltage VSS.

The second voltage level determining part 222 comprises fourth through sixth switching portions 222-1 through 222-3. The fourth switching portion 222-1 outputs the pumping voltage VPP to the fifth switching portion 222-2 when the first select activation signal sel_act1 is disabled. The fourth switching portion 222-1 comprises a seventh transistor P34. The seventh transistor P34 has a gate which receives the first select activation signal sel_act1 as an input, a source which receives the pumping voltage VPP, and a drain to which the fifth switching portion 222-2 is connected. The fifth switching portion 222-2 transfers the pumping voltage VPP outputted from the fourth switching portion 222-1 to a second output node node_out2 when the first shifting signal en1_ls has the level of the ground voltage VSS. The fifth switching portion 222-2 comprises eighth and ninth transistors P35 and P36. The eighth transistor P35 has a gate which receives the first shifting signal en1_ls as an input, and a source to which the drain of the seventh transistor P34 is connected. The ninth transistor P36 has a gate which receives the ground voltage VSS, a source to which the drain of the eighth transistor P35 is connected, and a drain to which the second output node node_out2 is connected. The sixth switching portion 222-3 applies the ground voltage VSS to the second output node node_out2 when the first select activation signal sel_act1 is enabled. The sixth switching portion 222-3 comprises a tenth transistor N32. The tenth transistor N32 has a gate which receives the first select activation signal sel_act1 as an input, a drain to which the second output node node_out2 is connected, and a source which receives the ground voltage VSS.

Exemplary operations of the level shifting circuit and the nonvolatile semiconductor memory apparatus in accordance with the embodiment of the present invention are described below.

If only the first enable signal en1 of the first enable signal en1 and the second enable signal en2 is enabled, both the select signal sel and the driving control signal act_ctrl are enabled.

If only the second enable signal en2 of the first enable signal en1 and the second enable signal en2 is enabled, the select signal sel is disabled and the driving control signal act_ctrl is enabled.

If both the first enable signal en1 and the second enable signal en2 are disabled, the driving control signal act_ctrl is disabled.

If the driving control signal act_ctrl is enabled and the select signal sel is enabled, the first select activation signal sel_act1 is enabled and the second select activation signal sel_act2 is disabled.

If the driving control signal act_ctrl is enabled and the select signal sel is disabled, the first select activation signal sel_act1 is disabled and the second select activation signal sel_act2 is enabled.

If the driving control signal act_ctrl is disabled, both the first and second select activation signals sel_act1 and sel_act2 are enabled irrespective of the select signal sel.

If only the first select activation signal sel_act1 of the first select activation signal sel_act1 and the second select activation signal sel_act2 is enabled, the first shifting signal en1_ls is enabled to the level of the pumping voltage VPP, and the second shifting signal en2_ls is disabled to the level of the ground voltage VSS.

If only the second select activation signal sel_act2 of the first select activation signal sel_act1 and the second select activation signal sel_act2 is enabled, the first shifting signal en1_ls is disabled to the level of the ground voltage VSS, and the second shifting signal en2_ls is enabled to the level of the pumping voltage VPP.

If both the first and second select activation signals sel_act1 and sel_act2 are enabled, both the first and second shifting signals en1_ls and en2_ls are disabled to the level of the ground voltage VSS.

If only the first shifting signal en1_ls of the first and second shifting signals en1_ls and en2_ls is enabled to the level of the pumping voltage VPP, the program voltage V_pgm is applied to the word line WL.

If only the second shifting signal en2_ls of the first and second shifting signals en1_ls and en2_ls is enabled to the level of the pumping voltage VPP, the pass voltage V_pass is applied to the word line WL.

If both the first and second shifting signals en1_ls and en2_ls are disabled to the level of the ground voltage VSS, the application of the program voltage V_pgm and the pass voltage V_pass to the word line WL is intercepted.

A level shifting operation is described below in detail with reference to FIG. 7.

The first select activation signal sel_act1 is enabled to the level of the supply voltage VCC, and the second select activation signal sel_act2 is disabled to the level of the ground voltage VSS. The sixth switching portion 222-3 applies the ground voltage VSS to the second output node node_out2. As the sixth switching portion 222-3 applies the ground voltage VSS to the second output node node_out2, the second shifting signal en2_ls with the level of the ground voltage VSS is generated. Meanwhile, the first switching portion 221-1 outputs the pumping voltage VPP to the second switching portion 221-2. If the second switching portion 221-2 applies the pumping voltage VPP to the first output node node_out1, the first shifting signal en1_ls with the level of the pumping voltage VPP is generated.

As a consequence, if the first select activation signal sel_act1 is enabled and the second select activation signal sel_act2 is disabled, the first shifting signal en1_ls is enabled to the level of the pumping voltage VPP, and the second shifting signal en2_ls is disabled to the level of the ground voltage VSS.

The first select activation signal sel_act1 is disabled to the level of the ground voltage VSS, and the second select activation signal sel_act2 is enabled to the level of the supply voltage VCC. The third switching portion 221-3 applies the ground voltage VSS to the first output node node_out1. The first shifting signal en1_ls with the level of the ground voltage VSS is generated. Meanwhile, the fourth switching portion 222-1 outputs the pumping voltage VPP to the fifth switching portion 222-2. The fifth switching portion 222-2 applies the pumping voltage VPP to the second output node node_out2. The second shifting signal en2_ls with the level of the pumping voltage VPP is generated.

As a consequence, if the first select activation signal sel_act1 is disabled and the second select activation signal sel_act2 is enabled, the first shifting signal en1_ls is disabled to the level of the ground voltage VSS, and the second shifting signal en2_ls is enabled to the level of the pumping voltage VPP.

Both the first select activation signal sel_act1 and the second select activation signal sel_act2 are enabled to the level of the supply voltage VCC.

The third switching portion 221-3 applies the ground voltage VSS to the first output node node_out1, and the sixth switching portion 222-3 applies the ground voltage VSS to the second output node node_out2.

As a consequence, if both the first and second select activation signals sel_act1 and sel_act2 are enabled, both the first and second shifting signals en1_ls and en2_ls are disabled to the level of the ground voltage VSS.

Figure 2:
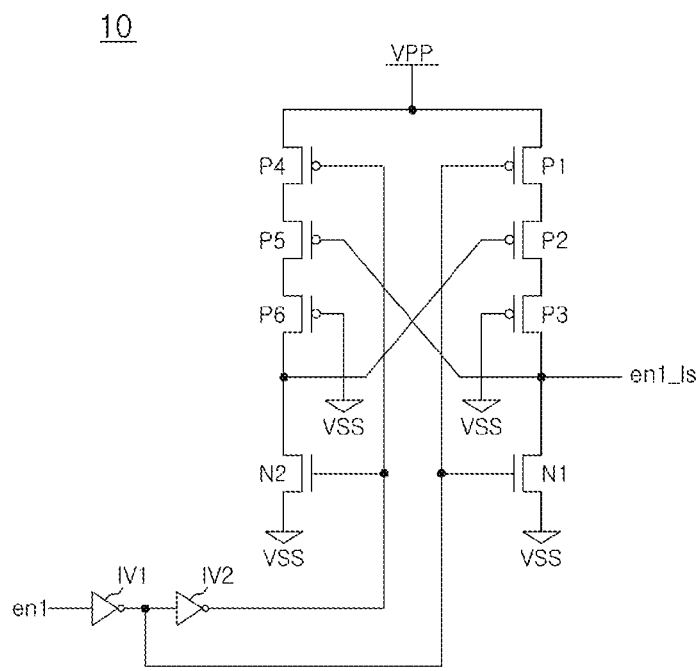
FIG. 2 is a diagram showing a configuration of a first level shifter of related art shown in FIG. 1.

Comparing FIG. 2 and FIG. 7, respectively illustrating the conventional art and the present invention, it is to be understood that the present invention provides advantages in that, since two shifting signals can be generated while using the same number of transistors, area efficiency is improved.

While a certain embodiment has been described above, it will be understood to those skilled in the art that the embodiment described is by way of example only. Accordingly, the level shifting circuit and the nonvolatile semiconductor memory apparatus using the same described herein should not be limited based on the described embodiment. Rather, the level shifting circuit and the nonvolatile semiconductor memory apparatus using the same described herein should only be limited in light of the claims that follow when taken in conjunction with the above description and accompanying drawings.

What is claimed is:

1. A nonvolatile semiconductor memory apparatus comprising:
   a control unit configured to generate a select signal and a driving control signal in response to a first enable signal and a second enable signal;
   a level shifting unit configured to enable a first shifting signal or a second shifting signal to a level of a pumping voltage in response to the select signal and the driving control signal;
   a first switching unit configured to apply a program voltage to a word line when the first shifting signal is enabled to the level of the pumping voltage; and
   a second switching unit configured to apply a pass voltage to the word line when the second shifting signal is enabled to the level of the pumping voltage.

2. The nonvolatile semiconductor memory apparatus according to claim 1, wherein the control unit is configured to enable the driving control signal when any one of the first and second enable signals are enabled, enable the select signal when only the first enable signal of the first and second enable signals is enabled, and disable the select signal when only the second enable signal of the first and second enable signals is enabled.

3. The nonvolatile semiconductor memory apparatus according to claim 1, further comprising:
   a driving control signal generation section configured to disable the driving control signal when both the first and second enable signals are disabled; and
   a select signal generation section configured to enable the select signal when the first enable signal is enabled and the second enable signal is disabled, and disable the select signal when the first enable signal is disabled and the second enable signal is enabled.

4. The nonvolatile semiconductor memory apparatus according to claim 1, wherein the level shifting unit is configured to enable the first shifting signal or the second shifting signal to the level of the pumping voltage in response to the select signal when the driving control signal is enabled.

5. The nonvolatile semiconductor memory apparatus according to claim 1, wherein the level shifting unit is configured to disable both the first and second shifting signals to a level of a ground voltage irrespective of the select signal when the driving control signal is disabled.

6. The nonvolatile semiconductor memory apparatus according to claim 5, wherein the level shifting unit is configured to enable the first shifting signal to the level of the pumping voltage and disable the second shifting signal to the level of the ground voltage when the driving control signal is enabled and the select signal is enabled, and disable the first shifting signal to the level of the ground voltage and enables the second shifting signal to the level of the pumping voltage when the driving control signal is enabled and the select signal is disabled.

7. The nonvolatile semiconductor memory apparatus according to claim 5, further comprising:
   a select activation control section configured to enable both a first select activation signal and a second select activation signal irrespective of the select signal when the driving control signal is disabled, and enable one of the first and second select activation signals in response to the select signal when the driving control signal is enabled; and
   a signal select type level shifter configured to enable the first shifting signal to the level of the pumping voltage and disable the second shifting signal to the level of the ground voltage when only the first select activation signal of the first and second select activation signals is enabled, and enable the second shifting signal to the level of the pumping voltage and disable the first shifting signal to the level of the ground voltage when only the second select activation signal of the first and second select activation signals is enabled.

8. The nonvolatile semiconductor memory apparatus according to claim 7, wherein the select activation control section is configured to enable the first select activation signal and disable the second select activation signal when the driving control signal is enabled and the select signal is enabled, and enable the second select activation signal and disable the first select activation signal when the driving control signal is enabled and the select signal is disabled.

9. The nonvolatile semiconductor memory apparatus according to claim 7, wherein the signal select type level shifter is configured to disable both the first and second shifting signals to the level of the ground voltage when both the first select activation signal and the second select activation signal are enabled.

10. The nonvolatile semiconductor memory apparatus according to claim 7, wherein the signal select type level shifter comprises:
    a first voltage level determining part configured to determine a voltage level of the first shifting signal in response to the second select activation signal and the second shifting signal; and
    a second voltage level determining part configured to determine a voltage level of the second shifting signal in response to the first select activation signal and the first shifting signal.

11. The nonvolatile semiconductor memory apparatus according to claim 10, wherein the first voltage level determining part is configured to determine the level of the ground voltage as the voltage level of the first shifting signal when the second select activation signal is enabled, and determine the level of the pumping voltage as the voltage level of the first shifting signal when the second select activation signal is disabled and the second shifting signal has the level of the ground voltage.

12. The nonvolatile semiconductor memory apparatus according to claim 10, further comprising:
    a first switching portion configured to output the pumping voltage when the second select activation signal is disabled;
    a second switching portion configured to transfer the pumping voltage outputted from the first switching portion to an output node when the second shifting signal has the level of the ground voltage; and
    a third switching portion configured to apply the ground voltage to the output node when the second select activation signal is enabled, and
    wherein the voltage level of the first shifting signal is outputted as a voltage level of the output node.

13. The nonvolatile semiconductor memory apparatus according to claim 10, wherein the first voltage level determining part is configured to determine the level of the ground voltage as the voltage level of the second shifting signal when the first select activation signal is enabled, and determine the level of the pumping voltage as the voltage level of the second shifting signal when the first select activation signal is disabled and the first shifting signal has the level of the ground voltage.

14. The nonvolatile semiconductor memory apparatus according to claim 10, further comprising:
- a fourth switching portion configured to output the pumping voltage when the first select activation signal is disabled;
- a fifth switching portion configured to transfer the pumping voltage outputted from the fourth switching portion to an output node when the first shifting signal has the level of the ground voltage; and
- a sixth switching portion configured to apply the ground voltage to the output node when the first select activation signal is enabled, and
- wherein the voltage level of the second shifting signal is outputted as a voltage level of the output node.

15. A level shifting circuit of a nonvolatile semiconductor memory apparatus, comprising:
- a level shifting unit configured to enable a first shifting signal or a second shifting signal to a level of a pumping voltage in response to a select signal when a driving control signal is enabled, and disable both the first shifting signal and the second shifting signal to a level of a ground voltage when the driving control signal is disabled.

16. The level shifting circuit according to claim 15, wherein the level shifting unit is configured to enable the first shifting signal to the level of the pumping voltage and disable the second shifting signal to the level of the ground voltage when the driving control signal is enabled and the select signal is enabled, and disable the first shifting signal to the level of the ground voltage and enable the second shifting signal to the level of the pumping voltage when the driving control signal is enabled and the select signal is disabled.

17. The level shifting circuit according to claim 15, further comprising:
- a select activation control section configured to enable one of a first select activation signal and a second select activation signal and disable the other in response to the select signal when the driving control signal is enabled, and enable both the first and second select activation signals irrespective of the select signal when the driving control signal is disabled; and
- a signal select type level shifter configured to enable one of the first shifting signal and the second shifting signal to the level of the pumping voltage and disable the other to the level of the ground voltage when one of the first select activation signal and the second select activation signal is enabled and the other is disabled, and disable both the first shifting signal and the second shifting signal to the level of the ground voltage when both the first select activation signal and the second select activation signal are enabled.

18. The level shifting circuit according to claim 17, further comprising:
- a first voltage level determining part configured to generate the first shifting signal with the level of the ground voltage when the second select activation signal is enabled, and generate the first shifting signal with the level of the pumping voltage when the second select activation signal is disabled and the second shifting signal has the level of the ground voltage; and
- a second voltage level determining part configured to generate the second shifting signal with the level of the ground voltage when the first select activation signal is enabled, and generate the second shifting signal with the level of the pumping voltage when the first select activation signal is disabled and the first shifting signal has the level of the ground voltage.

19. The level shifting circuit according to claim 17, further comprising:
- a first switching portion configured to output the pumping voltage when the second select activation signal is disabled;
- a second switching portion configured to transfer the pumping voltage outputted from the first switching portion to an output node when the second shifting signal has the level of the ground voltage; and
- a third switching portion configured to apply the ground voltage to the output node when the second select activation signal is enabled, and
- wherein the voltage level of the first shifting signal is outputted as a voltage level of the output node.

20. The level shifting circuit according to claim 17, further comprising:
- a fourth switching portion configured to output the pumping voltage when the first select activation signal is disabled;
- a fifth switching portion configured to transfer the pumping voltage outputted from the fourth switching portion to an output node when the first shifting signal has the level of the ground voltage; and
- a sixth switching portion configured to apply the ground voltage to the output node when the first select activation signal is enabled, and
- wherein the voltage level of the second shifting signal is outputted as a voltage level of the output node.

21. A level shifting circuit of a nonvolatile semiconductor memory apparatus, configured to enable a first shifting signal or a second shifting signal to a level of a pumping voltage when a first select activation signal or a second select activation signal is enabled to a level of a supply voltage, with a voltage level of a first output node corresponding to a voltage level of the first shifting signal and a voltage level of a second output node corresponding to a voltage level of the second shifting signal, the level shifting circuit comprising:
- a first switching portion configured to apply a ground voltage to the second output node when the first select activation signal is enabled;
- a second switching portion configured to apply the ground voltage to the first output node when the second select activation signal is enabled;
- a third switching portion configured to output the pumping voltage when the first select activation signal is disabled;
- a fourth switching portion configured to apply the pumping voltage outputted from the third switching portion to the second output node when the first output node receives the ground voltage;
- a fifth switching portion configured to output the pumping voltage when the second select activation signal is disabled; and
- a sixth switching portion configured to apply the pumping voltage outputted from the fifth switching portion to the first output node when the second output node receives the ground voltage.

22. The level shifting circuit according to claim 21, wherein the level of the pumping voltage is higher than the level of the supply voltage.

* * * * *